United States Patent
Inamiya et al.

(10) Patent No.: US 9,293,616 B2
(45) Date of Patent: *Mar. 22, 2016

(54) SOLAR CELL SEALING FILM AND SOLAR CELL USING THE SAME

(71) Applicant: BRIDGESTONE CORPORATION, Chuo-ku, Tokyo (JP)

(72) Inventors: Takato Inamiya, Yokohama (JP); Hisataka Kataoka, Yokohama (JP); Norihiko Kaga, Yokohama (JP); Yasunori Tarutani, Yokohama (JP)

(73) Assignee: BRIDGESTONE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/374,946

(22) PCT Filed: Jan. 25, 2013

(86) PCT No.: PCT/JP2013/051580
§ 371 (c)(1),
(2) Date: Jul. 28, 2014

(87) PCT Pub. No.: WO2013/111853
PCT Pub. Date: Aug. 1, 2013

(65) Prior Publication Data
US 2014/0366945 A1    Dec. 18, 2014

(30) Foreign Application Priority Data
Jan. 27, 2012 (JP) .................. 2012-015258

(51) Int. Cl.
*C08L 23/10* (2006.01)
*H01L 31/048* (2014.01)
*C08L 23/08* (2006.01)
*C09D 123/08* (2006.01)
*C08K 5/14* (2006.01)

(52) U.S. Cl.
CPC .......... *H01L 31/0481* (2013.01); *C08L 23/0815* (2013.01); *C08L 23/0853* (2013.01); *C09D 123/0853* (2013.01); *C08K 5/14* (2013.01); *C08L 2203/204* (2013.01); *C08L 2312/00* (2013.01); *Y02E 10/50* (2013.01)

(58) Field of Classification Search
CPC ............ H01L 31/0481; C08L 23/0815; C08L 23/0853; C08L 2203/204; C08L 2312/00; C08K 5/14; Y02E 10/50
USPC ........................................................ 136/259
See application file for complete search history.

(56) References Cited

U.S. PATENT DOCUMENTS

2011/0045287 A1* 2/2011 Kawashima et al. ......... 428/345
2015/0007888 A1* 1/2015 Inamiya et al. ............... 136/259

FOREIGN PATENT DOCUMENTS

| JP | 2002-235048 A | 8/2002 |
| JP | 2011-9484 A | 1/2011 |
| JP | 2011-74264 A | 4/2011 |
| WO | 2012/002264 A1 | 1/2012 |

OTHER PUBLICATIONS

International Search Report for PCT/JP2013/051580 dated Feb. 26, 2013 (PCT/ISA/210).

* cited by examiner

*Primary Examiner* — Nathan M Nutter
(74) *Attorney, Agent, or Firm* — Sughrue Mion, PLLC

(57) ABSTRACT

The present invention provides a solar cell sealing film whereby generation of gas is decreased. The solar cell sealing film comprises a resin mixture of an ethylene-vinyl acetate copolymer and a polyethylene, and an organic peroxide. The mass ratio (EVA:PE) of the ethylene-vinyl acetate copolymer (EVA) to the polyethylene (PE) is 8:2 to 3:7, the content of the organic peroxide is 0.1 to 1.0 parts by mass based on 100 parts by mass of the resin mixture, and the gel rate after crosslinking is 20 to 80% by mass.

6 Claims, 1 Drawing Sheet

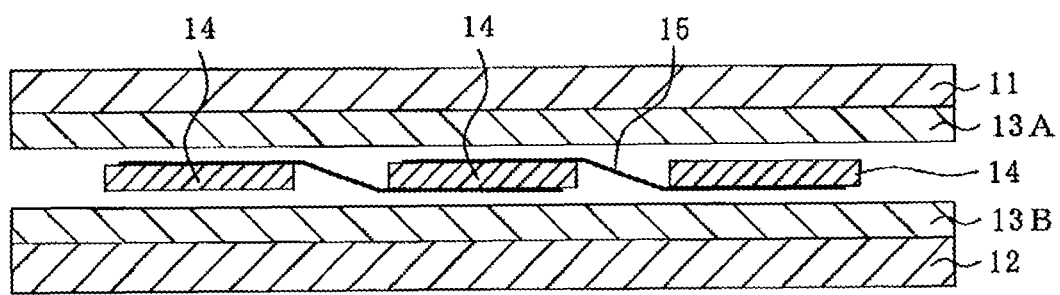

SOLAR CELL SEALING FILM AND SOLAR CELL USING THE SAME

CROSS REFERENCE TO RELATED APPLICATIONS

This application is a National Stage of International Application No. PCT/JP2013/051580 filed Jan. 25, 2013, claiming priority based on Japanese Patent Application No.2012-015258 filed Jan. 27, 2012, the contents of all of which are incorporated herein by reference in their entirety.

TECHNICAL FIELD

The present invention relates to a solar cell sealing film for a solar cell, especially relates to a solar cell sealing film in which generation of gas is reduced.

BACKGROUND ART

In recent years, a solar cell has been widely employed as a device directly converting solar energy into electric energy from the viewpoints of effective use of natural resources and prevention of environmental pollution. Further developments of solar cells are in progress with the object of power generation efficiency and durability.

As shown in FIG. 1, in general, the solar cell is produced by laminating a light receiving side transparent protection material 11 such as a glass substrate, a light receiving side sealing film 13A, a photovoltaic elements 14 such as crystalline silicon cells, a backside sealing film 13B and a backside protection material (back cover) 12 in this order, degassing in evacuated state, crosslinking and curing the light receiving side sealing film 13A and backside sealing film 13B, and adhesively combining them.

In order to generate a large electrical output, the solar cell has plural photovoltaic elements 14 connected to each other by using a connecting tab(s) 15. Therefore, photovoltaic elements are sealed by using insulating sealing films 13A, 13B so as to maintain insulation property for photovoltaic elements 14.

In the related art, as a sealing film for such solar cells, a film made of ethylene-vinyl acetate copolymer such as ethylene-vinyl acetate copolymer (occasionally abbreviated to EVA) or ethylene-ethyl acrylate copolymer (EEA) is used. Especially, the EVA film is preferably used because it has low cost and high transparency. Furthermore, in the EVA film used for the sealing film, a crosslinker such as an organic peroxide other than EVA is used to improve crosslink density.

For instance, Patent Literature 1 discloses a solar cell sealing film in which an organic peroxide is used as a crosslinker and EVA of the sealing film is crosslinked up to 80 to 90% gel rate by heat in a step for adhesively combining with each member. As the result, the heat resistance of the solar cell is improved.

CITATION LIST

Patent Literatures

Patent Literature 1: Japanese patent publication laid-open No.2011-09484

SUMMARY OF INVENTION

Problem to be Solved by the Invention

However, when the organic peroxide is added to the sealing film, low molecular compound is generated and then gas is generated in or on the surface of the sealing film. If gas is generated, bubbles are accumulated between the film and other members configuring the solar cell, especially the back side protection material (normally, a plastic sheet) having relatively low adhesiveness, and such member is occasionally peeled off. When it is peeling off, not only are the sealing efficiency and photovoltaic efficiency deteriorated, but failure on the appearance is occurred.

It is therefore an object of the present invention is to provide a solar cell sealing film in which generation of gas is reduced.

Another object of the present invention is to provide a solar cell in which one or more photovoltaic elements are sealed by the solar cell sealing film.

Means for Solving Problem

The above objects are attained by a solar cell sealing film, which comprises a resin mixture of an ethylene-vinyl acetate copolymer and a polyethylene, and an organic peroxide, wherein a mass ratio (EVA:PE) of the ethylene-vinyl acetate copolymer (EVA) to the polyethylene (PE) is 8:2 to 3:7 in the resin mixture, wherein a content of the organic peroxide is 0.1 to 1.0 parts by mass based on 100 parts by mass of the resin mixture and wherein a gel rate after crosslinking is 20 to 80% by mass.

Advantageous Effects of Invention

According to the present invention, generation of gas in a solar cell sealing film is suppressed, the film is prevented from peeling off other member constituting the solar cell and the solar cell having high heat resistance can be obtained. Thus, the solar cell of the present invention can work with high power generation efficiency over a long period after installation.

BRIEF DESCRIPTION OF THE DRAWING

FIG. 1 is a schematic cross sectional view showing a structure of a general solar cell.

DESCRIPTION OF EMBODIMENTS

Hereinafter, the present invention will be explained in details. As mentioned, the solar cell sealing film (occasionally abbreviated to the sealing film) of the present invention contains a resin mixture of an ethylene-vinyl acetate copolymer and a polyethylene, and an organic peroxide. A content of the organic peroxide is 0.1 to 1.0 parts by mass based on 100 parts by mass of the resin mixture and the sealing film has 20 to 80% of a gel rate after crosslinking.

In the resin mixture, the mass ratio (EVA:PE) of the ethylene-vinyl acetate copolymer (EVA) to polyethylene (PE) is 8:2 to 3:7, preferably 6:4 to 3:7, more preferably 5.5:4.5 to 3:7. If the mass ratio is within any of the ranges above, the sealing film has excellent viscoelasticity at high temperature and has high heat resistance.

Melting point of the resin mixture of EVA and PE is preferably 65 to 105° C., more preferably 70 to 95° C. If the melting point is in any of the ranges above, it is possible to sufficiently mix and knead a composition for forming the sealing film without decomposing the organic peroxide by heat in a step for forming the sealing film composition into a film shape. Here, in the present invention, melting point means the temperature when a target sample has a viscosity of 30,000 Pa·s and it can be determined by following procedures. The viscosity is measured at every 1° C. increment under the condition of the test speed 1 mm/min by using a Viscometer Capilo-graph 1D (furnace body diameter: φ 9.55 mm, capillary: φ1.0×10 mm, Toyo Seiki Co.,) and the temperature at the viscosity of 30,000 Pa·s is measured and thus the melting point is determined.

The solar cell sealing film of the present invention can be produced by mixing and kneading a sealing film forming composition containing EVA, PE and organic peroxide, followed by forming it in a sheet shaped. In the present invention, the solar cell sealing film has a gel rate of 20 to 80% by mass, preferably 30 to 80% by mass after crosslinking.

The gel rate can be obtained by following steps of, weighing the solar cell sealing film after crosslinking [A(g)], dipping the film into xylene at 120° C. for 24 hours, filtrating insoluble substance by using a metal net having 200 mesh, vacuum-drying residue on the metal net, measuring weight of dried residue [B(g)] and finally calculating by using a following formula.

Gel rate (% by mass)=$(B/A)\times100$

According to the invention, the amount of the organic peroxide to be contained in the sealing film is less than the prior art. Thus, it is possible to reduce generation of low molecule compound which may generate gas. Meanwhile, the crosslinkability is lowered to a gel rate of 20 to 80% by mass because of reducing the amount of the organic peroxide, however, viscoelasticity at high temperature is improved by adding polyethylene at the mass ratio above and excellent heat resistance can be obtained.

In the present invention, a storage elastic modulus (G') of the solar cell sealing film at 80° C. is preferably $1.0\times10^6$ Pa·s or more. The storage elastic modulus (G') can be determined by using a viscoelasticity measuring apparatus (Product name: Leo Stress RS300, manufactured by HAAKE) with a parallel plate jig having φ=8 mm under condition of measurement thickness 10 mm, measurement temperature 80° C. and frequency 1 Hz. The upper limit of the storage elastic modulus (G') is not specifically limited to but is $1.0\times10^8$ Pa·s, for example.

The content rate of vinyl acetate in the ethylene-vinyl acetate copolymer is preferably 20 to 35% by mass, more preferably 26 to 32% by mass. If the content rate of vinyl acetate is less than 20% by mass, enough adhesiveness as the sealing film cannot be obtained and the film may easily slip off. If the content rate of vinyl acetate is more than 35% by mass, acid is generated and bubbles may be easily produced at the interface between the sealing film and protection material.

In the present invention, the content rate of vinyl acetate in EVA is a value measured by using a method described in JIS K 6924-1. It is preferable that the ethylene-vinyl acetate copolymer itself has the melting point of 60 to 90° C., more preferably 66 to 76° C.

Polyethylene contained in the resin mixture is, as defined by JIS, a polymer mainly containing ethylene and includes homopolymer of ethylene, copolymer of ethylene and 5 mol % or less of α-olefin having a carbon number of 3 or more (for example, butene-1, hexene-1,4-methyl pentene-1 and octene-1), and a copolymer of ethylene and 1 mol % or less of non-olefin monomer having only carbon, oxygen and hydrogen atoms in a functional group(s) thereof (JIS K 6922-1: 1997). In general, PE is classified based on the density thereof. High density polyethylene (HDPE), low density polyethylene (LDPE) and linear low density polyethylene (LLDPE) are indicated, for example.

LDPE has, in general, a long chain branch obtained by polymerizing ethylene in the presence of a radical generator such as organic peroxide under the high pressure of 100 to 350 MPa and has the density (confirming to JIS K7112, the same shall apply hereafter), in general, 0.910 g/cm³ or more and less than 0.930 g/cm³. LLDPE is, in general, obtained by copolymerizing ethylene and α-olefin in the presence of a transition metal catalyst such as a Ziegler-type catalyst, a Phillips catalyst and a metallocene-type catalyst and has the density, in general, 0.910 g/cm³ to 0.940 g/cm³, preferably 0.910 g/cm³ to 0.930 g/cm³. HDPE is a polyethylene having, in general, the density 0.942 g/cm³ to 0.970 g/cm³.

Considering workability, the low density polyethylene or linear low density polyethylene is preferably used as the polyethylene in the present invention. The melting point of the polyethylene itself is preferably 99 to 121° C.

Melt flow rates (MFR) of the above ethylene-vinyl acetate copolymer and polyethylene are not specifically limited to and can be selected appropriately.

The solar cell sealing film of the present invention contains an organic peroxide, as described above. The content of the organic peroxide is 0.1 to 1.0 parts by mass, more preferably 0.3 to 0.8 parts by mass based on 100 parts by mass of the resin mixture. By using the organic peroxide at such small amount, it is possible to suppress generation of the low molecule compound which is generated by decomposition of the organic peroxide and thus bubbling and peeling can be suppressed.

The preferable organic peroxide has 90 to 120° C. of 10 hour half-life period temperature. The organic peroxide, in general, selected by considering melting point of the resin mixture, film forming temperature, preparing condition of the composition, curing temperature, heat resistance of the adherend and storage stability.

Examples of the organic peroxide, for example, include benzoyl peroxide curing agent, tert-hexyl peroxypivalate, tert-butyl peroxy pivalate, 3,5,5-trimethylhexanoyl peroxide, di-n-octanoyl peroxide, lauroyl peroxide, stearoyl peroxide, 1,1,3,3-tetramethylbutylperoxy-2-ethyl hexanoate, succinic acid peroxide, 2,5-dimethyl-2,5-di(tert-butylperoxy)hexane, 2,5-dimethyl-2,5-di(2-ethylhexanoylperoxy)hexane, 1-cyclohexyl-1-methylethylperoxy-2-ethylhexanoate, tert-hexylperoxy-2-ethylhexanoate, tert-butylperoxy-2-ethyl hexyl mono carbonate, 4-methylbenzoyl peroxide, tert-butylperoxy-2-ethyl hexanoate, m-toluoyl+benzoylperoxide, benzoyl peroxide, 1,1-bis(tert-butylperoxy)-2-methylcyclohexanoate, 1,1-bis(tert-hexylperoxy)-3,3,5-trimethylcyclohexanoate, 1,1-bis(tert-hexylperoxy)cyclohexanoate, 1,1-bis(tert-butylperoxy)-3,3,5-trimethylcyclohexane, 1,1-bis(tert-butylperoxy)cyclohexane, 2,2-bis(4,4-di-tert-butylperoxycyclohexyl)propane, 1,1-bis(tert-butylperoxy)cyclododecane, tert-hexylperoxyisopropyl monocarbonate, tert-butylperoxy maleic acid, tert-butylperoxy-3,3,5-trimethyl hexane, tert-butyl peroxylaurate, 2,5-dimethyl-2,5-di(methylbenzoylperoxy)hexane, tert-butylperoxyisopropyl monocarbonate, tert-butylperoxy-2-ethylhexyl monocarbonate, tert-hexyl peroxybenzoate, and 2,5-dimethyl-2,5-di(benzoylperoxy)hexane.

Examples of the benzoyl peroxide curing agent, for example, include benzoyl peroxide, 2,5-dimethylhexyl-2,5-bisperoxy benzoate, p-chlorobenzoyl peroxide, m-toluoyl peroxide, 2,4-dicyclobenzoyl peroxide, t-butylperoxy benzoate. The benzoyl peroxide-type cure agents can be employed singly or in combination of two or more kinds.

The particularly preferred organic peroxides are 2,5-dimethyl-2,5-di(tert-butylperoxy)hexane and tert-butylperoxy-2-ethylhexyl monocarbonate which bring about a solar cell sealing film in which bubbling is efficiently suppressed.

The solar cell sealing film, before crosslinking and curing, preferably contains crosslinking auxiliary agent. The crosslinking auxiliary agent enables increase of the crosslinking density and improvement of adhesive property, heat resistance and durability of the solar cell sealing film.

The crosslinking auxiliary agent can be used in the range of 0.1 to 3.0 parts by mass, preferably in the range of 0.1 to 2.5 parts by mass based on 100 parts by mass of the resin mixture. Such content of the crosslinking auxiliary agent brings about an improvement of the crosslinking density without generating gas due to the addition of the crosslinking auxiliary agent.

Examples of the crosslinking auxiliary agents (compounds having radical polymerizable groups as functional groups) include tri-functional cross-linking auxiliary agents such as triallyl cyanurate and triallyl isocyanurate, and mono- or bi-functional crosslinking auxiliary agents of (meth)acryl esters (e.g., NK Ester, etc.). Among these compounds, triallyl cyanurate and triallyl isocyanurate are preferred, especially triallyl isocyanurate.

The solar cell sealing film preferably has excellent adhesion from the viewpoint of sealing performance within a solar cell. Therefore the sealing film preferably contains an adhesion improver. As the adhesion improver, silane-coupling agents can be employed whereby a solar cell sealing film having excellent adhesion strength can be obtained. Examples of the silane-coupling agents include γ-chloropropylmethoxysilane, vinyltriethoxysilane, vinyltris(β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyp-ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. Those silane-coupling agents can be used singly, or in combination of two or more kinds. Especially, γ-methacryloxypropyltrimethoxysilane is preferred.

The content of the silane coupling agent is preferably 5 parts by mass or less, particularly in the range of 0.1 to 2 parts by mass based on 100 parts by mass of the resin mixture.

The solar cell sealing film of the present invention can further contain, if necessary, various additives such as plasticizers, acryloxy group-containing compounds, methacryloxy group-containing compounds and/or epoxy group-containing compounds, for improvement or adjustment of various properties of the film (e.g., mechanical strength, optical characteristics such as transparency, heat-resistance, light-resistance, or crosslinking rate, etc.), especially for improvement of mechanical strength.

Generally, polybasic acid esters and polyhydric alcohol esters can be used as the plasticizer, although there are not particular restrictions to plasticizer to be used. Examples of the plasticizers include dioctyl phthalate, dihexyl adipate, triethylene glycol-di-2-ethylbutyrate, butyl sebacate, tetraethylene glycol diheptanoate and triethylene glycol dipelargonate. The plasticizers can be used singly, or in combination of two or more kinds. The plasticizer is preferably contained in amount of 5 parts by mass or less based on 100 parts by mass of the resin mixture.

Generally, derivatives of acrylic acid or methacrylic acid such as esters and amides of acrylic acid or methacrylic acid can be used as the acryloxy group-containing compound and methacryloxy group-containing compound. Examples of the ester residue include linear alkyl groups (e.g., methyl, ethyl, dodecyl, stearyl and lauryl), cyclohexyl group, tetrahydrofurfuryl group, aminoethyl group, 2-hydroxyethyl group, 3-hydroxypropyl group, 3-chloro-2-hydroxypropyl group. Example of the amide includes diacetone acryl amide. Further, examples include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group-containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether.

The content of acryloxy group-containing compounds, methacryloxy group-containing compounds or epoxy group-containing compounds is preferably in the range of 0.5 to 5.0 parts by mass in general, particularly in the range of 1.0 to 4.0 parts by mass based on 100 parts by mass of the above resin mixture, respectively.

The solar cell sealing film of the invention may contains an aging inhibitor. Examples of the aging inhibitors include hindered phenol-type antioxidants such as N,N'-hexane-1,6-diyl-bis[3-(3,5-di-tert-butyl-4-hydroxyphenyl)propionamide], phosphorus-type heat stabilizers, lactone-type heat stabilizers, vitamin E-type heat stabilizers and sulfur-type heat stabilizers.

The solar cell sealing film of the invention can be prepared in accordance with heretofore known processes. For example, the sealing film can be prepared by molding a composition including each component above into a sheet-shaped product by usual extrusion-molding or calendar molding (calendaring). The sheet-shaped product can also be prepared by dissolving the above composition in solvent, coating the solution on an appropriate support by an appropriate coating machine (coater) and drying as to form a coating film. Additionally, the heat temperature (to form film) is preferably a temperature that the crosslinker causes no reaction or little reactions. The thickness of the solar cell sealing film, though is not particularly restricted, preferably is in the range of 0.05 mm to 2.0 mm.

For sufficiently sealing the photovoltaic elements in the solar cell, for instance, a light receiving side transparent protection material 11, a solar cell sealing film of the invention (a light receiving side sealing film) 13A, photovoltaic elements 14 such as crystalline silicon cells, a solar cell sealing film of the invention (backside sealing film) 13B and a backside protection material 12 are laminated in this order, as shown in FIG. 1. Thereafter, the sealing films are crosslinked and cured according to a conventional process such as the application of heating and pressure.

For example, the laminated body can be bonded under the application of heating and pressure by using a vacuum laminator under the condition of temperature of 135 to 180° C., preferably 140 to 180° C., especially 155 to 180° C., degassing time period of 0.1 min to 5 min, pressing pressure of 0.1 to 1.5 kg/cm² and pressing time period of 5 min to 15 min. By the heating and pressing, the resin of the resin mixture contained in the light receiving side sealing film 13A and back side sealing film 13B is crosslinked. Thus, the light receiving side transparent protection material 11, backside transparent material 12 and photovoltaic elements 14 are combined via the light receiving side sealing film 13A and backside sealing film 13B so that photovoltaic elements 14 can be sealed.

The light receiving side transparent protection material 11 preferably used in the solar cell of the invention is generally a glass substrate such as silicate glass. The thickness of the glass substrate is generally in the range of 0.1 mm to 10 mm, preferably 0.3 mm to 5 mm. The glass substrate can be chemically or thermally tempered.

The backside protection material 12 for use in the invention is preferably a plastic film such as polyethylene terephthalate (PET). The backside protection material 12 may be added with a white pigment whereby permeating sunlight can be reflected and enter into photovoltaic elements so that the power generation efficiency is improved. From the viewpoint of heat resistance and heat-moisture resistance, a fluorinated polyethylene film or especially a film having structure of fluorinated polyethylene film/Al/fluorinated polyethylene film laminated in this order is preferred.

Especially, the solar cell sealing film of the present invention is preferably uses as a solar cell sealing film (the back side sealing film) of a solar cell having a light receiving side transparent protection material, a backside protection material and one or more photovoltaic element(s) provided therebetween and the backside sealing film is arranged between the photovoltaic element(s) and back side protection material. As the result, it is possible to efficiently prevent peeling, which may be easily occurred by bubbling, of the film from the back side protection material (generally, a plastic sheet is used for)

The structure of the solar cell of the invention is not particularly restricted. Examples of the structure include a structure that one or more photovoltaic elements are sealed by disposing a solar cell sealing film between a light receiving side transparent protection material and a backside protection material and by combining them. In the invention, "light receiving side" corresponds to a side of the photovoltaic element irradiated with the light, whereas "backside" corresponds to the reverse side of the light receiving side of the photovoltaic elements.

The invention can be utilized for not only a solar cell using single-crystalline or polycrystalline silicon crystal type photovoltaic elements as shown in FIG. 1, but also thin-film solar cells such as a thin-film silicon type solar cell, a thin-film amorphous silicon type solar cell and a copper indium selenide (CIS) type solar cell. In such cases, examples of the structure thereof includes, for example, a structure made by forming a thin film photovoltaic element layer on a surface of a light receiving side transparent protection material such as a glass substrate, a polyimide substrate and a fluorine resin type transparent substrate by chemical vapor deposition, laminating a solar cell sealing film and a back side protection material on the thin film photovoltaic element layer, and adhesively binding them. Examples of the structure also includes a structure made by forming thin film photovoltaic elements on a surface of a back side protection material, laminating a solar cell sealing film and a light receiving side transparent protection material on the thin film photovoltaic elements, and adhesively binding them. Alternatively, examples of the structure includes a structure made by laminating a light receiving side transparent protection material, a light receiving side sealing film, thin film photovoltaic elements, a backside sealing film and a back side protection material in this order, and adhesively binding them.

The invention is explained in detail using the following Examples.

EXAMPLES

Each material of the formulation set forth in following tables was fed into a roll mill and was mixed and needed at the temperature as a higher of the melting points (° C.) of EVA or PE (that is, the melting point of PE). Thus, the solar cell sealing film composition was prepared. The solar cell sealing film composition was subjected to calendaring processing at the melting point of each composition and then cooled to produce the solar cell sealing film (0.5 mm).

[Evaluation Methods]

1. Gel Rate

The solar cell sealing film described above was placed in an oven and was crosslinked and cured by heating at 155° C. for 30 minutes. This cured solar cell sealing film was weighed [A (g)] and was dipped into xylene at 120° C. for 24 hours. Insoluble substance was filtrated by using a metal net having 200-mesh, the residue on the metal net was dried in vacuum, the weight of the dried residue was measured and the gel rate is calculated by using the following formula.

Gel rate (% by mass)=$(B/A) \times 100$

2. Storage Elastic Modulus (G')

For the solar cell sealing film described above, the storage elastic modulus (G') was measured by using a viscoelasticity measuring apparatus (Product name: Leo Stress RS300, manufactured by HAAKE). At the time, the measurement was done by using a parallel plate jig with $\phi=8$ mm under condition of measurement thickness 10 mm, measurement temperature 80° C. and frequency 1 Hz. A circle was given to the case that the elastic modulus of $1.0 \times 10^6$ Pa·s or more was obtained, while a mark X was given to the case that the elastic modulus of less than $1.0 \times 10^6$ Pa·s was obtained.

3. Bubbling (Expansion)

A laminate, in which a glass/a light receiving side sealing film/photovoltaic elements (single-crystalline silicon cells)/a backside sealing film/a PET film were laminated in this order, was heated and pressed for 10 minutes at 150° C. by using a vacuum laminator. As the result, each member was integrally combined each other and a solar cell was obtained. Each solar cell sealing film above was used as the back side sealing film. A sealing film, made by using the following formulation, was used as the light receiving side sealing film.

(Formulation of the Light Receiving Side Sealing Film)

Ethylene-vinyl acetate copolymer: 100 parts by mass

Organic peroxide (Perhexa 25B: 2,5-dimethyl-2,5-di(tert-butylperoxy) hexane): 2 parts by mass Crosslinking auxiliary agent (TAIC: triallyl isocyanurate, manufactured by Nippon Kasei Chemical Co., Ltd.): 1.5 parts by mass Silane-coupling agent(KBM503: γ-methacryloxypropyltrimethoxysilane): 0.3 parts by mass This solar cell was left at temperature of 80° C. for 2000 hours. The evaluation was done by looking and observing the presence or absence of the expansion between the backside sealing film and PET film after being left. A circle was given to the case that the expansion was not recognized, while a X mark was given to the case that the expansion was recognized.

4. Electromotive Force

With regard to the solar cell obtained in a same way as above "3", a primary electromotive force and an electromotive force after passing 2000 hours of the solar cell were measured in a hot and humid condition (85° C., 85 RH %). A deterioration degree of the electromotive force after passing 2000 hours against to the primary electromotive force was calculated. A circle indicates a degree less than 5% and X indicates a degree 5% or more.

Results are shown in the following tables. "Melting point" shown in the tables is the melting point of the resin mixture of EVA and PE. For the melting point of the resin mixture, a viscosity of the resin mixture was measured at every 1° C. increment under the condition of the test speed 1 mm/min by using Viscometer Capilo-graph 1D (furnace body diameter: $\phi$ 9.55 mm, capillary: $\phi 1.0 \times 10$ mm, Toyo Seiki Co.,), temperature at the viscosity of 30,000 Pa·s is measured and such temperature is treated as the melting point.

TABLE 1

| | | | EXAMPLE | | | | | | | | | | | | |
|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 |
| FORMULATION (parts by mass) | EVA | UE750 | 50 | 80 | 60 | 50 | 30 | 50 | — | — | — | — | — | — | 70 | 60 |
| | | UE634 | — | — | — | — | — | — | 50 | 50 | 50 | 50 | 50 | 50 | — | — |
| | PE | 0540F | 50 | — | — | — | — | — | 50 | — | — | — | — | — | — | — |
| | | Petrosen 202 | — | 20 | 40 | 50 | 70 | — | — | 50 | 50 | 50 | 50 | — | 30 | 40 |
| | | UF230 | — | — | — | — | — | 50 | — | — | — | — | — | 50 | — | — |
| | Organic peroxide | Perhexa 25B | 0.3 | 0.3 | 0.3 | 0.3 | 0.3 | 0.3 | 0.3 | 0.3 | 0.5 | 0.8 | 1.0 | 0.3 | 0.3 | — |
| | | Perbutyl E | — | — | — | — | — | — | — | — | — | — | — | — | — | 0.3 |
| | Crosslinking auxiliary agent | TAIC | 1.5 | 1.5 | 1.5 | 1.5 | 1.5 | 1.5 | 1.5 | 1.5 | 1.5 | 1.5 | 1.5 | 1.5 | 1.5 | 1.5 |
| | Silane coupling agent | KBM503 | 0.3 | 0.3 | 0.3 | 0.3 | 0.3 | 0.3 | 0.3 | 0.3 | 0.3 | 0.3 | 0.3 | 0.3 | 0.3 | 0.3 |
| CHARACTERISTIC | Melting point (° C.) | | 83 | 70 | 72 | 73 | 80 | 76 | 88 | 91 | 91 | 91 | 91 | 99 | 71 | 72 |
| | Gel rate (% by mass) | | 45 | 55 | 48 | 45 | 42 | 50 | 50 | 50 | 60 | 70 | 75 | 50 | 51 | 50 |
| | Storage elastic modulus (G') at 80° C. | | ○ | ○ | ○ | ○ | ○ | ○ | ○ | ○ | ○ | ○ | ○ | ○ | ○ | ○ |
| EVALUATION | Solar cell characteristic | Bubbling | ○ | ○ | ○ | ○ | ○ | ○ | ○ | ○ | ○ | ○ | ○ | ○ | ○ | ○ |
| | | Electromotive force property | ○ | ○ | ○ | ○ | ○ | ○ | ○ | ○ | ○ | ○ | ○ | ○ | ○ | ○ |
| | EVALUATION IN TOTAL | | ○ | ○ | ○ | ○ | ○ | ○ | ○ | ○ | ○ | ○ | ○ | ○ | ○ | ○ |

TABLE 2

| | | | COMPARATIVE EXAMPLE | | | | | | | | | | | | |
|---|---|---|---|---|---|---|---|---|---|---|---|---|---|---|---|
| | | | 1 | 2 | 3 | 4 | 5 | 6 | 7 | 8 | 9 | 10 | 11 | 12 | 13 |
| FORMULATION (parts by mass) | EVA | UE750 | 100 | 100 | — | — | 50 | 90 | 20 | 50 | 50 | — | — | — | 60 |
| | | UE634 | — | — | 100 | 100 | — | — | — | — | — | 50 | 50 | 50 | — |
| | PE | 0540F | — | — | — | — | 50 | — | — | — | — | 50 | — | — | — |
| | | Petrosen 202 | — | — | — | — | — | 10 | 80 | 50 | — | — | 50 | — | 40 |
| | | UF230 | — | — | — | — | — | — | — | — | 50 | — | — | 50 | — |
| | Organic peroxide | Perhexa 25B | 0.3 | 2 | 0.3 | 2 | 2 | 0.3 | 0.3 | 2 | 2 | 2 | 2 | 2 | 0.05 |
| | | Perbutyl E | — | — | — | — | — | — | — | — | — | — | — | — | — |
| | Crosslinking auxiliary agent | TAIC | 1.5 | 1.5 | 1.5 | 1.5 | 1.5 | 1.5 | 1.5 | 1.5 | 1.5 | 1.5 | 1.5 | 1.5 | 1.5 |
| | Silane coupling agent | KBM503 | 0.3 | 0.3 | 0.3 | 0.3 | 0.3 | 0.3 | 0.3 | 0.3 | 0.3 | 0.3 | 0.3 | 0.3 | 0.3 |
| CHARACTERISTIC | Melting point (° C.) | | 66 | 66 | 76 | 76 | 83 | 68 | 90 | 73 | 76 | 88 | 91 | 99 | 72 |
| | Gel rate (% by mass) | | 60 | 95 | 58 | 95 | 80 | 58 | 40 | 80 | 80 | 80 | 80 | 80 | 18 |
| | Storage elastic modulus (G') at 80° C. | | X | ○ | X | ○ | ○ | X | ○ | ○ | ○ | ○ | ○ | ○ | ○ |
| EVALUATION | Solar cell characteristic | Bubbling | ○ | X | ○ | X | X | ○ | ○ | X | X | X | X | X | ○ |
| | | Electromotive force property | X | X | X | X | X | X | X | X | X | X | X | X | X |
| | EVALUATION IN TOTAL | | X | X | X | X | X | X | X | X | X | X | X | X | X |

Note)
UE750: Ethylene-vinyl acetate copolymer (vinyl acetate content rate 32% by mass, MFR 30 g/10 min, melting point 66° C.), manufactured by Tosoh corporation.
UE634: Ethylene-vinyl acetate copolymer (vinyl acetate content rate 26% by mass, MFR 4.3 g/10 min, melting point 76° C.), manufactured by Tosoh corporation.
0540F: Linear low density polyethylene (generated by using metallocene catalyst, MFR 4 g/10 min, melting point 99° C.), manufactured by Ube Maruzen Polyethylene Co., Ltd.
Petrosen 202: Low density polyethylene (MFR 24 g/10 min, melting point 106° C.), manufactured by Tosoh corporation.
UF230: Linear low density polyethylene (MFR 1 g/10 min, melting point 121° C.), manufactured by Japan Polyethylene Corporation.
Perhexa 25B: 2,5-dimethyl-2,5-di(tert-butylperoxy)hexane (10 hour half-life period temperature is 118° C.), manufactured by Nihon Yushi corporation.
Perbutyl E: tert-butylperoxy-2-ethylhexyl monocarbonate (10 hour half-life period temperature is 99° C.), manufactured by Nihon Yushi corporation.
TAIC: triallyl isocyanurate, manufactured by Nippon Kasei Chemical Co., Ltd.
KBM503: γ-methacryloxypropyltrimethoxysilane, manufactured by Shin-Etsu Chemical Co., Ltd.

[Evaluation Result]

As shown in tables above, sealing films made by using the formulation written as "examples" showed excellent results in bubbling and electromotive force property tests. Meanwhile, the expansion caused by bubbling was found in the comparative examples having a large content of organic peroxide such as 2 parts by mass. Moreover, even when the content of organic peroxide was small as 0.3 parts by mass, it was found that the storage elastic modulus and/or electromotive force property were deteriorated in the cases that the mass ratio of EVA:PE was out of the range of 8:2 to 3:7. In the case having too less organic peroxide (comparative example 13), the electromotive force property was deteriorated (it was considered that such phenomena was caused by deterioration of the heat resistance accompanied by the lower gel rate).

DESCRIPTION OF REFERENCE NUMBER

11: light receiving side transparent protection material
12: backside protection material
13A: light receiving side sealing film
13B: backside sealing film
14: photovoltaic element
15: connecting tab

What is claimed is:

1. A solar cell sealing film comprising, a resin mixture of an ethylene-vinyl acetate copolymer and a polyethylene, and an organic peroxide,
wherein a mass ratio (EVA:PE) of the ethylene-vinyl acetate copolymer (EVA) to the polyethylene (PE) in the resin mixture is 8:2 to 3:7,
wherein a content of the organic peroxide is 0.1 to 1.0 parts by mass based on 100 parts by mass of the resin mixture,
wherein a gel rate after crosslinking is 30 to 80% by mass, and
wherein the polyethylene is a low density polyethylene (LDPE) having density of 0.910 g/cm$^3$ or more and less than 0.930 g/cm$^3$, or a liner low density polyethylene (LLDPE) having a density of 910 g/cm$^3$ to 0.940 g/cm$^3$.

2. The solar cell sealing film according to claim 1, wherein a storage elastic modulus (G') at 80° C. is $1.0 \times 10^6$ Pa·s or more.

3. The solar cell sealing film according to claim 1, wherein a melting point of the resin mixture, which is a temperature at a viscosity of 30,000 Pa·s, is 65 to 105° C.

4. The solar cell sealing film according to claim 1, wherein a content rate of vinyl acetate in the ethylene-vinyl acetate copolymer is 20 to 35% by mass.

5. The solar cell sealing film according to claim 1, wherein the solar cell sealing film is a film of a solar cell having a light receiving side transparent protection material, a backside protection material and a photovoltaic element provided therebetween, and is arranged between the photovoltaic element and the back side protection material.

6. A solar cell comprising a photovoltaic element sealed by a solar cell sealing film according to claim 1.

* * * * *